(12) United States Patent
Schmidt

(10) Patent No.: US 7,115,355 B2
(45) Date of Patent: Oct. 3, 2006

(54) FABRICATION OF SUB-WAVELENGTH STRUCTURES

(75) Inventor: Markus Schmidt, Seibersbach (DE)

(73) Assignee: International Business Machine Corporation, Armonk, NY (US)

( * ) Notice: Subject to any disclaimer, the term of this patent is extended or adjusted under 35 U.S.C. 154(b) by 455 days.

(21) Appl. No.: 10/707,451

(22) Filed: Dec. 15, 2003

(65) Prior Publication Data

US 2004/0115568 A1 Jun. 17, 2004

(30) Foreign Application Priority Data

Dec. 18, 2002 (EP) .................................. 02102798

(51) Int. Cl.
*G03F 7/00* (2006.01)

(52) U.S. Cl. ...................... 430/322; 430/325; 430/326

(58) Field of Classification Search ..................... None
See application file for complete search history.

(56) References Cited

U.S. PATENT DOCUMENTS

| 6,187,482 B1* | 2/2001 | Kuroda et al. ................. 430/5 |
| 6,569,575 B1* | 5/2003 | Biebuyck et al. ............. 430/5 |
| 6,653,030 B1* | 11/2003 | Mei et al. ...................... 430/5 |
| 6,671,034 B1* | 12/2003 | Hatakeyama et al. ......... 355/67 |
| 2005/0130074 A1* | 6/2005 | Krause et al. .............. 430/322 |

* cited by examiner

*Primary Examiner*—John A. McPherson
(74) *Attorney, Agent, or Firm*—Yuanmin Cai

(57) ABSTRACT

A method for the manufacture of sub-wavelength structures on substrates is provided, wherein a deformable photoresist is arranged on a substrate. A hydrophilic stamp (made of a material having a higher refractive index than the photoresist) is used to imprint wave guiding structures into the deformable photoresist. Light is coupled into the wave guiding structures to create evanescent waves to expose the photoresist. By imprinting critical dimensions on the substrate and subsequently exposing the resist by means of optical structures integrated in the stamp, those critical dimensions can be further reduced.

15 Claims, 2 Drawing Sheets

FABRICATION OF SUB-WAVELENGTH STRUCTURES

BACKGROUND OF INVENTION

The present invention relates in general to polymer-lithographic processes. Specifically, the present invention is concerned with a process for the fabrication of sub-wavelength structures.

In semiconductor technology and in microelectronics, the dimensions of structures are becoming smaller and smaller. In memory production today, e.g., structures with a width of less than 400 nm are produced using optical lithography in combination with the masking technique. Photolithographic processes are vital steps in the fabrication of, e.g., semiconductor devices. In a photolithographic process, an exposure light, usually ultraviolet (UV) light is used to expose a photoresist-coated semiconductor wafer through a mask (in the following called photomask). The purpose of the photolithographic process is to transfer a set of patterns representative of the circuit layer onto the wafer. The patterns on the photomask define the positions, shapes and sizes of various circuit elements such as diffusion areas, metal contacts and metallization layers, on the wafer.

In optical lithography a limit can be expected at approximately 150 nm because of diffraction effects.

However, structures with even smaller dimensions are required for new applications such as single-electron transistors or molecular electronic components. In the case of very high-frequency circuits this is also true in conventional electronics. There is also a need to reduce, e.g., the read and write dimensions in thin film magnetic heads. In addition to that, micro structures having a very high aspect ratio of about 5 to 30 and greater will be needed.

The resolution of conventional optical lithography schemes is mainly limited by the wavelength of the light used for the transfer of a mask pattern onto a resist. The wavelength of the exposing radiation is a main determinant of pattern resolution W, given by the Rayleigh equation , where l is the wavelength of the exposing light, NA is the numerical aperture of the optical lithography tool, and k1 is a constant for a specific lithography process. In other words, the resolution W is proportional to the wavelength l of the exposing light. Cutting-edge production today creates features that are 130 nm wide, using 248 nm illumination. Currently, the implementing schemes based on light are the bottleneck when trying to obtain structures of a feature size below 100 nm. State-of-the-art optical lithography systems for making current DRAMs, for example, are quite expensive. Alternative processes become attractive when moving on to smaller feature sizes, but the required investments are huge. Thus, techniques that maintain compatibility with existing processes are inherently valuable.

One well-known form of optical lithography is the so-called hard-contact lithography, where a mask is put directly into contact with a substrate to be patterned. Features on the mask, comprising alternatively translucent and opaque regions in a well-defined pattern, are transferred into a photoresist in a 1:1 relation to their dimensions on the mask. Hard-contact lithography can, in principle, make structures with sizes below the wavelength of illumination, but the contact used to place the mask on the substrate compromises the integrity of the process as the possibility of confounding material on the surface of the mask and mask damage greatly limit the useful number of times the mask can be used. Cost is particularly worrisome as the feature scale shrinks and the expense of mask fabrication skyrockets with the increase in the density of its features. Contact masks are also generally much more expensive than those used in optical-projection lithography since for an equivalent resolution the critical dimensions in the former need to be smaller than those in the latter, by the reduction factor used in a projection system. Dust particles and other physical impediments to the substrate are catastrophic in hard-contact lithography as they lift the mask away from the surface, blurring the pattern. Such defects appear over an area much larger than the obscuring particle because the mask is unable to conform around their presence; this problem is compounded as the feature scale shrinks such that even a 200 nm particle can be harmful. In addition, the resist can get stuck to the mask. Hard-contact lithography has thus not found a significant role in manufacturing of small-scale integrated circuits.

There are many approaches known, that improve conventional lithography systems in that filters, projection lenses, or appropriately modified masks are employed. These approaches become increasingly complicated and expensive with reduced feature scale. One example is the so-called optical-projection lithography. The optical lithography based on projection is a very successful and widely employed means of making features down to 200 nm. Here, a pattern of intensity variations in the far field results when light is shone through a mask like that used in contact lithography. The light propagates through air and is focused by a lens to create an image of the desired pattern on a resist-covered substrate, often demagnified by a factor of 5–10 from its size on the mask. Projection lithography is largely limited to features sizes equal or larger than the wavelength I of light. Its implementation becomes increasingly difficult as the scale shrinks towards and below 200 nm, where very complicated systems of lenses and materials are required to carry out existing and proposed schemes. The area over which uniform illumination can be achieved is particularly problematic The maximum current field size with the best 248-nmexposure tool is now only 30×30 mm.

It is generally a disadvantage of most of these approaches that they are getting more and more complicated and expensive when trying to obtain smaller feature sizes. Furthermore, there is a tradeoff between maximum resolution, depth of focus and achievable field image which comes from the use of a lens to focus the light.

European Patent Office publication EP-A-1 001 311 proposes a patterning device with which incident light is guidable at least partially to at least one cover element which is in contact with the patterning device. The cover element comprises light-sensitive material and is arranged on top of a substrate protrusion element on a surface of a substrate and/or is itself structured on a substrate.

Though many approaches have been made to arrive at critical dimensions by using conventional lithography systems, there is still a need for uncomplicated and low-cost methods for small feature generation.

On the other hand, printing from a patterned surface to thin layers of material is a well known and well documented process in printing industry.

Printing processes were originally developed for the exchange and storage of information adapted to human vision. This field of application requires pattern and overlay accuracies down to 20 µm for high-quality reproduction. In a few cases, printing processes have been used for technological patterning, e.g., gravure offset printing was used to make 50-µm-wide conductor lines on ceramic substrates, and to pattern thin-film transistors for low-cost displays. Offset printing was used for the fabrication of capacitors and printed and plated metal lines as narrow as 25 µm. Finally, printed circuit boards and integrated circuit packaging are popular applications of screen printing in the electronics industry. (B. Michel et al., IBM J. Res. Develop. 45, 697 (2001) and references therein).

In a process known as flexography, viscous ink is printed onto porous paper and permeable plastic. Flexography is a direct rotary printing method that uses resilient relief image plates of rubber or other resilient materials including photopolymers to print an image on diverse types of materials that are typically difficult to image with traditional offset or gravure processes, such as cardboard, plastic films and virtually any type of substrate whether absorbent or nonabsorbent. As such it has found great applications and market potential in the packaging industry. Usually, the viscous ink prevents a direct contact of the stamp with the substrate because it cannot be displaced quickly enough during the fast printing operations. The transfer of a thick layer of ink is desired in this typical mode of operation but also prevents replication of laterally small features—this is the main reason why printed feature sizes cannot be smaller than 20 μm. Printing onto metal foils has been implemented in a few applications but is much more difficult than other processes (H. Kipphan, "Handbuch der Printmedien", Springer Berlin, 2000 and J. M. Adams, D. D. Faux, and J. J. Rieber, "Printing Technology 4th Ed.", Delamare Publishers, Albany, N.Y.).

Microcontact printing uses a similar stamp as flexography does, but typically transfers a monolayer of ink onto an impermeable metal surface. A more general process now called soft lithography is successfully applied in different variants to print thiols and other chemicals to a wide variety of surfaces. Typically, the chemicals are first applied to the patterned stamp surface as solutions in a volatile solvent or using a contact inker pad. After inking and drying, the molecules are present in the bulk and on the surface of the stamp in a "dry" state and are transferred to the surface by a mechanical contact. Reasons for the choice of poly-(dimethyl)siloxane (PDMS) as the stamp material are its good rubber-like elasticity, a chemistry similar to glass, the possibility to buffer ink molecules, and (very important) its excellent gas permeability that enables small amounts of air to dissolve into or escape through the stamp matrix. (see B. Michel et al. "Printing meets lithography", IBM, J. Res. Develop. 45 (5), 697 (2001)).

There remains a need for a method for the manufacture of sub-wavelength structures that are not diffraction restricted, and particularly for structures having increased aspect ratios, so that existing critical dimensions may be narrowed still further.

SUMMARY OF INVENTION

The present invention addresses the above-described need by providing a method for the manufacture of sub-wavelength structures on a substrate. In accordance with the present invention, this is done by providing a deformable photoresist on the substrate, and forming a hydrophilic stamp (made of a material having a higher refractive index than the photoresist) carrying wave guiding structures. The wave guiding structures are then imprinted into the deformable photoresist by bringing the stamp and the substrate in close contact. Light is coupled into the wave guiding structures to create evanescent waves to expose the photoresist; the photoresisist is then developed. The photoresist may be either positive or negative photoresist. The wave guiding structures may be formed by a mask production method or alternatively by a replica method from a precursor. An example of material for the stamp is poly-(dimethyl)siloxane. The coupling of the light may be performed using a grating structure, a prism structure or via optical fiber connectors. The stamp may advantageously be covered with a metal layer such as chromium. The size of the sub-wavelength structures can be varied in accordance with the material of the stamp and/or the photoresist, or in accordance with a wavelength of light used to expose the photoresist. The critical dimensions of said the sub-wavelength structures may depend on an entrance depth of the evanescent waves.

DETAILED DESCRIPTION

A preferred embodiment of the invention involves a combination of integrated optics, using waveguide structures and imprinting techniques, using elastomeric stamps.

Imprinting is able to resolve small structures below 100 nm for moderate aspect ratios and resist thickness. For a given structure produced by stamping, the dimension can be further reduced and the aspect ratio increased by curing or exposing the imprinted pre-polymer through the stamp integrated optics structure.

The method lowers the necessary preconditions for the fabrication of the stamp structures. This is similar to processes like Ion Beam Trimming or Slimming and provides a substantially smaller photo structure. Aspect ratios are accordingly increased.

The stamp is fabricated by standard methods like electron beam lithography and dry etching into a material able to support exposure by UV-light, e.g., quartz and SiN but with a higher refractive index than the polymer used, e.g., crosslinked polymer or poly-(dimethyl)siloxane to allow conditions of total internal reflection needed to support guided modes. The stamp is structured in a way that wave guiding structures are formed either directly, using mask production methods such as e-beam exposure and etching into the material, or by using a replica method from a precursor. Coupling of light into the wave guiding structures is done with grating- or prism-like structures or via optical fiber connectors to feed light from an external source into an optical fiber and then into the wave guiding structures on the stamp. The mask is covered with a layer of metal, e.g., chromium, on all horizontal surfaces. Light is trapped within the wave guiding structures and depending on the geometry and material composition waveguide modes are established which are mostly confined to the core of the waveguide but to a certain amount extend into the surrounding photosensitive material. It is important that there are no propagating but only evanescent waves outside the mask material. Propagation of light is only taking place in the core of the waveguide.

Figure 1A:
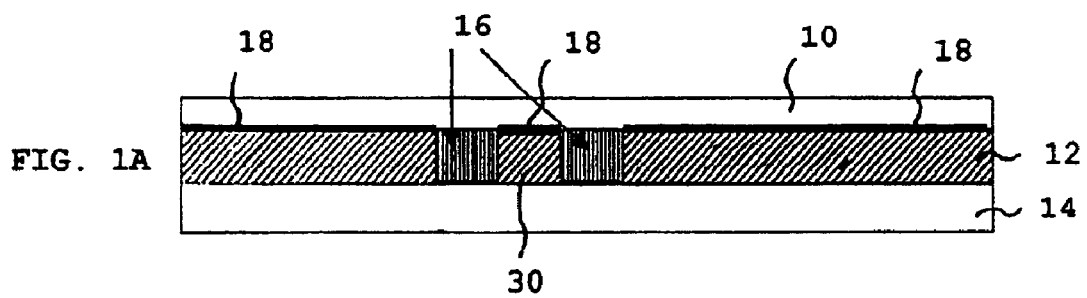
FIGS. 1A to 1D schematically depict the process steps according to a first embodiment of the invention when using a positive photo resist.

FIG. 1A schematically shows how the pre-structure formed on the stamp 10 is imprinted into a photoresistive material (photoresist) 12 formed on the substrate 14 to be processed. The substrate material 14 to be stamped is covered by the photoresistive material 12 which is able to be deformed by stamping. As shown in FIG. 1A, the stamp 10 and the substrate material 14 are brought in close contact and the photoresistive material 12 is displaced. Therefore, the photoresistive material 12 is structured as a replica of the stamp structure. As can be seen in FIG. 1A, the wave guiding structures 16 formed on the stamp 10 will thus immerse into the light-sensitive material, i.e., the photoresistive material 12, and a region of a critical dimension 30 is formed. As has already been mentioned, the stamp is covered with a metal layer 18, e.g., chromium, on all horizontal surfaces not to allow direct exposure on the photoresisitive material in the case when the light incoupling is done with grating- or prism-like structures. It can also be advantageous to cover the whole stamp including the wave guiding structures only leaving open the areas especially used for incoupling of light established with grating- or prism-like structures.

Figure 1B:
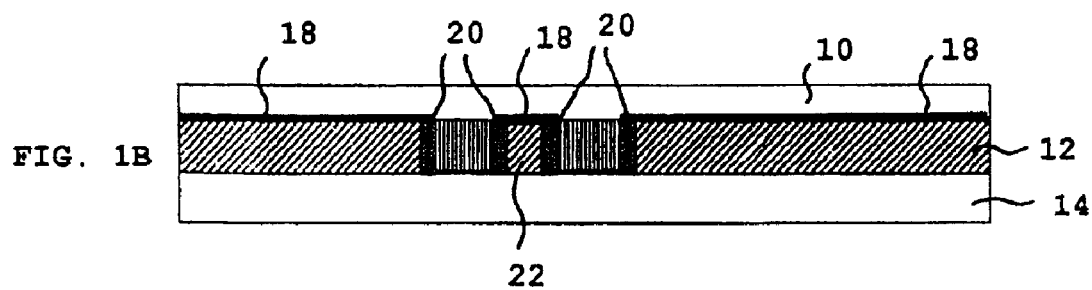

Next, the wave guiding structures 16 within the stamp 10 are fed by the coupling mechanism within the stamp, i.e., the grating or prism like structures, with the appropriate wavelength for the exposure of the photosensitive material 12. On the interfaces between the stamp material and the photosensitive material 12 evanescent waves will expose the photosensitive material 12, leaving exposed areas 20 (FIG. 1B).

Figure 1C:
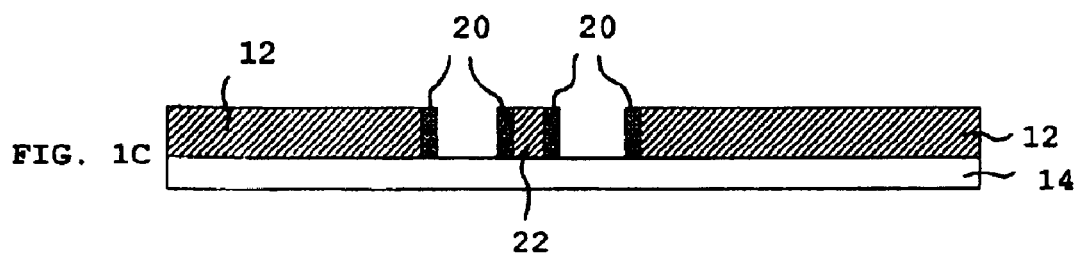

In the next step, the stamp is removed from the substrate and the photoresist material, leaving the structure shown in FIG. 1C.

Figure 1D:
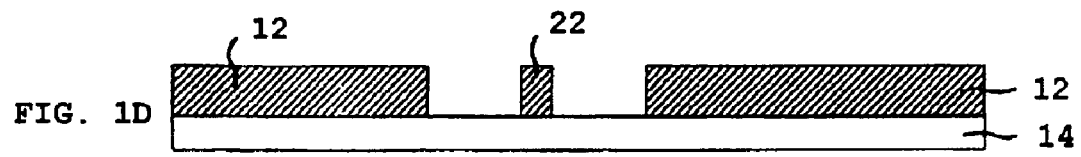
Figure 2A:
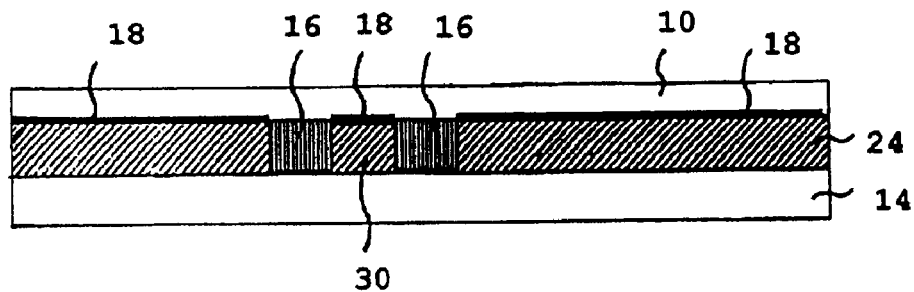
FIGS. 2A to 2D schematically show the process steps according to a second embodiment of the invention when using a negative photo resist.
Figure 2B:
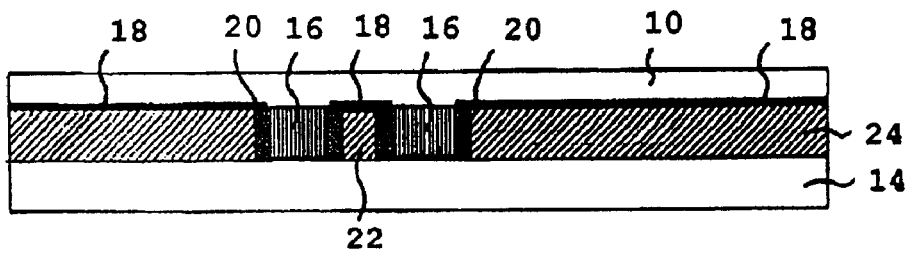
Figure 2C:
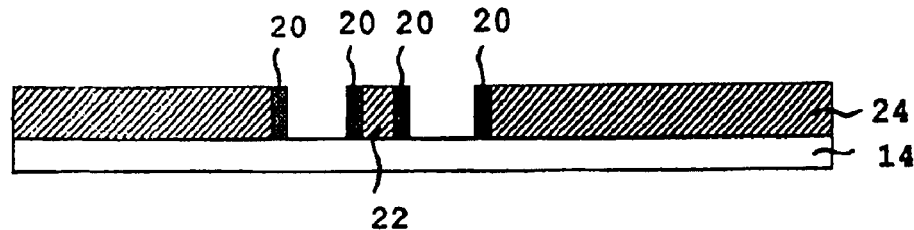
Figure 2D:
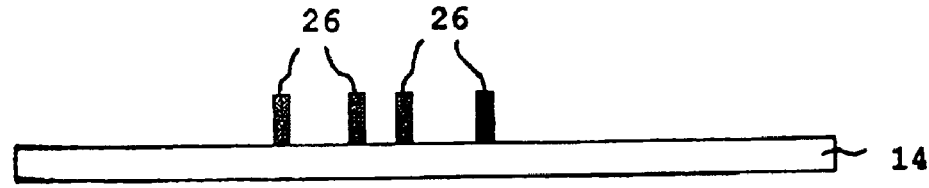

In the case of a positive photoresist 12, the exposed areas will be developed away leaving a resist line 22 between the regions cleared from photoresist by stamping the two adjacent wave guiding structures into the photoresist. This resist line will be smaller than the stamped resist line, i.e., the region of critical dimension 30, by the distance exposed by the evanescent waves established (FIG. 1D). Thus, by using evenescent waves produced by the waveguide structures 16, the structures present at the beginning of the process according to the invention (FIG. 1A) can be further narrowed (FIG. 1D).

FIGS. 2A to 2D depict the conditions when using a negative photoresistive material 24. As can be seen, the first steps (FIGS. 1A to 1C) are identical to the steps performed using the positive photoresistive material 12. However, in case of a negative resist 24 on both sides of a wave guide 16, lines 26 are formed that have a critical dimension according to the entrance depth of the evanescent waves. The entrance depth is given by the refractive index difference between the stamp and the photoresistive material and the absorbtive properties as well as the developing characteristic of the photoresistive material. The neighboring lines 28 formed between the two waveguides 16 form a space between resist structures that is to be made arbitrary small. Thus, structures can be produced that are not diffraction restricted.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for the manufacture of sub-wavelength structures on a substrate, the method comprising the steps of:
   providing a deformable photoresist on the substrate;
   forming a hydrophilic stamp made of a material having a higher refractive index than the photoresist, said stamp carrying wave guiding structures;
   imprinting said wave guiding structures into the deformable photoresist by bringing said stamp and the substrate in close contact;
   coupling light into the wave guiding structures, thereby creating evanescent waves to expose the photoresist; and
   developing the photoresisist.

2. A method according to claim 1, wherein the photoresist is a positive photoresist.

3. A method according to claim 1, wherein the photoresist is a negative photoresist.

4. A method according to claim 1, wherein said wave guiding structures are formed by a mask production method.

5. A method according to claim 1, wherein said wave guiding structures are formed by a replica method from a precursor.

6. A method according to claim 1, wherein said material comprises poly-(dimethyl)siloxane.

7. A method according to claim 1, wherein said coupling is performed using a grating structure.

8. A method according to claim 1, wherein said coupling is performed using a prism structure.

9. A method according to claim 1, wherein said coupling is performed via optical fiber connectors.

10. A method according to claim 1, further comprising covering said stamp with a metal layer.

11. A method according to claim 10, wherein said metal layer comprises chromium.

12. A method according to claim 1, wherein said sub-wavelength structures have a size which is variable in accordance with the material of said stamp.

13. A method according to claim 1, wherein said sub-wavelength structures have a size which is variable in accordance with the material of the photoresist.

14. A method according to claim 1, wherein said sub-wavelength structures have a size which is variable in accordance with a wavelength of light used to expose the photoresist.

15. A method according to claim 1, wherein critical dimensions of said sub-wavelength structures depend on an entrance depth of said evanescent waves.

* * * * *